(12) United States Patent
Palmer et al.

(10) Patent No.: US 11,945,746 B2
(45) Date of Patent: Apr. 2, 2024

(54) METHOD FOR DEPOSITING A COATING

(71) Applicant: PILKINGTON GROUP LIMITED, Lathom (GB)

(72) Inventors: Liam Sonie Palmer, Southport (GB); Peter Michael Harris, Chester (GB); Gary Robert Nichol, Warrington (GB)

(73) Assignee: Pilkington Group Limited, Lathom (GB)

( * ) Notice: Subject to any disclaimer, the term of this patent is extended or adjusted under 35 U.S.C. 154(b) by 13 days.

(21) Appl. No.: 17/526,137

(22) Filed: Nov. 15, 2021

(65) Prior Publication Data

US 2022/0073419 A1 Mar. 10, 2022

Related U.S. Application Data

(63) Continuation of application No. 15/780,259, filed as application No. PCT/GB2016/053781 on Dec. 1, 2016, now abandoned.

(30) Foreign Application Priority Data

Dec. 1, 2015 (GB) ...................................... 1521165

(51) Int. Cl.
*C03C 17/00* (2006.01)
*C03C 17/245* (2006.01)
(Continued)

(52) U.S. Cl.
CPC .......... *C03C 17/002* (2013.01); *C03C 17/245* (2013.01); *C03C 17/3411* (2013.01);
(Continued)

(58) Field of Classification Search
CPC . C03C 17/002; C03C 16/407; C03C 17/3411; C03C 17/3464; C03C 17/3417;
(Continued)

(56) References Cited

U.S. PATENT DOCUMENTS

| | | | |
|---|---|---|---|
| 2005/0221003 A1 | 10/2005 | Remington, Jr. | |
| 2009/0305057 A1* | 12/2009 | Ye | ..................... C23C 16/45595 65/60.2 |
| 2015/0017431 A1 | 1/2015 | Wang et al. | |

FOREIGN PATENT DOCUMENTS

| | | | | |
|---|---|---|---|---|
| EP | 0611733 A2 | 8/1994 | | |
| EP | 0879802 A2 * | 11/1998 | ........... | C03C 17/245 |

(Continued)

OTHER PUBLICATIONS

Richard J. Mccurdy, "Successful implementation methods of atmospheric CVD on a glass manufacturing line", Thin Solid Films, vol. 351, Aug. 30, 1999, pp. 66-72.

*Primary Examiner* — Michael G Miller
(74) *Attorney, Agent, or Firm* — Marshall & Melhorn, LLC

(57) ABSTRACT

The present invention relates to a method of depositing a coating comprising zinc oxide on a substrate; to a chemical vapour deposition precursor mixture for use in same and to a coated glass article and a photovoltaic cell prepared with a zinc oxide coating prepared using the method which comprises: providing a substrate, providing a precursor mixture comprising an alkyl zinc compound and a phosphorus source, the phosphorus source comprising a compound of formula $O_nP(OR)_3$, wherein n is 0 or 1 and each R is hydrocarbyl, and delivering the precursor mixture to a surface of the substrate.

19 Claims, 9 Drawing Sheets

(51) Int. Cl.
  *C03C 17/34*   (2006.01)
  *C23C 16/40*   (2006.01)
(52) U.S. Cl.
  CPC ...... *C03C 17/3417* (2013.01); *C03C 17/3464* (2013.01); *C23C 16/407* (2013.01); *C03C 2217/216* (2013.01); *C03C 2217/94* (2013.01); *C03C 2218/152* (2013.01); *C03C 2218/1525* (2013.01)
(58) Field of Classification Search
  CPC ............ C03C 17/245; C03C 2218/152; C03C 2217/216; C03C 2217/94; C03C 218/1525
  See application file for complete search history.

(56) References Cited

FOREIGN PATENT DOCUMENTS

| | | |
|---|---|---|
| EP | 0879802 A2 | 11/1998 |
| JP | 2007234996 A | 9/2007 |
| WO | 9806675 A1 | 2/1998 |
| WO | 2013136052 A2 | 9/2013 |
| WO | 2015177552 A1 | 11/2015 |

\* cited by examiner

METHOD FOR DEPOSITING A COATING

BACKGROUND OF THE INVENTION

The present invention relates to a method of depositing a coating comprising zinc oxide on substrates, to chemical vapour deposition precursor mixtures, to coated glass articles having coatings comprising zinc oxide on at least one surface, and to photovoltaic cells comprising such coated glass articles.

Metal oxide coatings on substrates have uses to modify the properties (for example, electrical, optical, emissive or surface properties) of the substrate. Metal oxide coatings on glass substrates are particular useful. One metal oxide coating of interest is zinc oxide.

Zinc oxide coated glass articles may be used as a superstrate or as a substrate in the manufacture of solar cells. Zinc oxide coatings may also have uses in low emissivity or solar control coatings.

Metal oxide coatings are typically produced by deposition of one or more thin film layers on, for example, a glass substrate. One coating method is pyrolysis, wherein fluid precursors (often in an inert carrier) are delivered to the substrate surface and react thereby depositing a coating. Chemical vapour deposition (CVD) is a type of pyrolysis whereby the precursors are delivered to the substrate surface in vapour or gaseous form.

For example, JP-A-2007 234996 discloses a method of manufacturing a thin film solar cell using a low-pressure CVD method to deposit a transparent conductive layer comprising zinc oxide using diethyl zinc or dimethyl zinc as a source of zinc, and water or $C_1$ to $C_5$ alcohol as a source of oxygen.

WO2015177552 discloses a method of forming a zinc oxide coating which comprises a certain level of sulphur, on a substrate by atmospheric pressure chemical vapour deposition, which includes the steps of forming a mixture of precursors comprising a zinc source, a sulphur source and an oxygen source, and directing said mixture to a surface of the substrate. The zinc source comprises at least one of dimethyl zinc and diethyl zinc, the sulphur source comprises at least one of an episulphide and a sulphoxide and the oxygen source comprises at least one of nitrous oxide; a carboxylic ester and dimethyl sulphoxide.

For glass substrates, an efficient coating method is on-line deposition, involving a precursor mixture being delivered to the surface of a glass ribbon during the float glass production process. At the surface, the precursors react to form a coating layer on the glass. This reaction is typically assisted by residual heat remaining in the glass during the float process. For example, WO-A-98/06675 describes the on-line coating of glass substrates by CVD. In a successful on-line coating operation, the thin films or layers produced are relatively mechanically and chemically durable compared to most soft coat films or layers.

Alkyl zinc compounds, for example dialkyl zinc compounds (for example, dimethyl zinc (DMZ) or diethyl zinc (DEZ)) are of interest as precursors for the deposition of zinc oxide. However, dialkyl zinc compounds are reactive and therefore may decompose in the delivery apparatus before reaching the desired substrate surface or, may pre-react with other components present in the precursor mixture before delivery to the substrate surface, leading undesirably to blockage of the CVD apparatus and exhaust systems with reaction products. This is a particular problem when the substrate temperature is above about 400° C., and so may be a particular problem, for example, when trying to operate such a CVD process online during float glass production.

There have been attempts to incorporate additives in the CVD precursor mixture to slow the pre-reaction of dialkyl zinc compounds with the other components of the precursor mixture. Such additives may become incorporated into the zinc oxide coating, affecting the properties of the coating. In some cases, this may be useful. However, there is a need for methods which do not lead to incorporation of such additives.

There have been successful methods developed employing separate precursor streams that mix at the substrate surface.

WO-A-2013/136052 discloses a CVD process for forming a gaseous mixture of an alkyl zinc compound and an inert gas as a first stream, providing a first gaseous inorganic oxygen-containing compound in a second stream and providing a second gaseous inorganic oxygen-containing compound in the second stream, a third stream or in both the second and third streams, and mixing the streams at or near a surface of the float glass ribbon during the float glass production process thereby depositing a zinc oxide coating.

In EP 0611733 A2, there is described a method of coating a moving substrate to provide a silica coating having a continuously varying chemical composition as the distance from the substrate-coating interface increases, in order to improve the low deposition rate of silica coatings by chemical vapour deposition. The method comprises directing a vapour coating composition toward a first predetermined position on the surface of the substrate, moving a first portion of the vapour along a first region of the substrate surface in a first direction and a second portion of the vapour along a second region of the substrate surface in a second direction opposite to the first direction. The first portion of the coating composition is maintained on the first region of the substrate surface for a longer period of time than the second portion of the vapor on the second region of the substrate surface to coat the substrate. The coating mixture includes tin containing precursors and a silicon precursor. A phosphorus containing precursor may also be used with the metal containing precursors.

Likewise, in a paper by McCurdy in the journal of Thin Solid Films, volume 351, 30 Aug. 1999, pages 66-72, entitled 'Successful implementation methods of atmospheric CVD on a glass manufacturing line', there is described the use of phosphates as a method of accelerating silica deposition using chemical vapour deposition techniques.

However, there remains a need for methods of depositing zinc oxide coatings, on substrates, particularly coated glass substrates, which do not require the provision of separate precursor streams and which are able to ensure deposition of the zinc oxide coating on the coated glass surface, rather than producing a powder as a gas phase reaction.

SUMMARY OF THE INVENTION

The present invention according provides, in a first aspect, a method of depositing a coating comprising zinc oxide on a substrate, the method comprising, providing a substrate, providing a precursor mixture comprising an alkyl zinc compound and a phosphorus source, the phosphorus source comprising a compound of formula $O_nP(OR^3)_3$, wherein n is 0 or 1 and each $R^3$ is hydrocarbyl, and delivering the precursor mixture to a surface of the substrate. Optionally, the precursor mixture may further comprise an oxygen source (that is, an oxidant).

This method is advantageous because it allows a premixed precursor to be used without unacceptable pre-reaction, and yet does not lead to unacceptable incorporation of for example phosphorus in the zinc oxide coating.

Preferably, the alkyl zinc compound is dialkyl zinc, preferably a dialkyl zinc of formula $R^1R^2Zn$, wherein $R^1$ and $R^2$ are each independently selected from a substituted or preferably unsubstituted $C_1$-$C_4$ alkyl or $C_6$-$C_{10}$ aryl (preferably phenyl). It is preferred that $R^1$ and $R^2$ are each independently selected from methyl or ethyl; and it is especially preferred that $R^1$ and $R^2$ are each methyl or each ethyl. The most preferred alkyl zinc compounds are diethyl zinc (DEZ) and/or dimethyl zinc (DMZ) because these compounds react readily, allowing formation of good coatings of zinc oxide at relatively high reaction rates.

Preferably, in the compound of formula $O_nP(OR^3)_3$, each $R^3$ is independently selected from $C_1$-$C_4$ alkyl or $C_6$-$C_{10}$ aryl, more preferably $C_1$-$C_4$ alkyl; more preferably methyl, ethyl, n-propyl, i-propyl, n-butyl or t-butyl. It is most preferred that each $R^3$ is methyl, ethyl, or propyl. Triethyl phosphite is particularly advantageous because, surprisingly, it greatly reduces or prevents pre-reaction when mixed with the alkyl zinc compounds and yet, surprisingly, phosphorus is not significantly incorporated in the zinc oxide coating layer.

The oxygen source may comprise an inorganic oxygen source, for example water, carbon dioxide, nitric oxide, nitrogen dioxide, nitrous oxide, oxygen (for example, from air) and/or mixtures thereof. Preferably, however, the oxygen source comprises an organic oxygen compound, more preferably the oxygen source comprises an ester, most preferably an alkyl ester. The ester advantageously comprises one or more alkyl acetates, for example, methyl acetate, ethyl acetate, propyl acetate, butyl acetate, or a mixture of two or more of these esters. The most preferred ester comprises t-butyl acetate.

Organic oxygen sources, particularly esters, are preferred because they may be mixed with the alkyl zinc compound in the presence of the phosphorus source without significant pre-reaction before delivery to the substrate surface. During delivery to the surface, the precursor mixture may additionally comprise an inorganic oxygen source as discussed above (for example, oxygen).

The precursor mixture may, if desired, comprise at least one dopant source, for example a boron containing compound, a magnesium containing compound, a gallium containing compound and/or an aluminium containing compound to dope the zinc oxide coating with for example, boron (B), magnesium (Mg), gallium (Ga) and/or aluminium (Al) respectively.

It is preferred that the precursor mixture is a gaseous precursor mixture, so that the method is preferably atmospheric pressure chemical vapour deposition.

The preferred substrate comprises glass, preferably coated glass for example glass having a coating already present on the surface and on which zinc oxide is deposited. The coated glass may comprise for example, silica coated glass or tin oxide coated glass. There may be further coatings deposited below the zinc oxide coating and one or more additional coatings deposited above the zinc oxide coating. The substrate preferably comprises float glass.

The surface of the substrate is preferably at a temperature at which the precursors react to form the zinc oxide coating. Thus, the surface of the substrate is preferably at a temperature in the range 300° C. to 800° C. More preferably, the surface of the substrate is at a temperature in the range 400° C. to 750° C. Even more preferably, the surface of the substrate is at a temperature in the range 410° C. to 750° C. Still more preferably, the surface of the substrate is at a temperature in the range 470° C. to 750° C. Most preferably, the surface of the substrate is at a temperature in the range 500° C. to 650° C. or 580° C. to 650° C.

The coating comprising zinc oxide is preferably deposited on-line during the float glass production process. The relatively high deposition rate that the precursor mixture provides enables good quality zinc oxide coatings of the desired thickness to be deposited, even on the moving (relative to the coating apparatus) glass ribbon during the float glass process.

Usually, if deposited during the float glass process, the coating comprising zinc oxide is deposited whilst a ribbon of the float glass is in a float bath.

The precursor mixture preferably further comprises a carrier gas. The carrier gas may comprise one or more gases selected from the group consisting of: nitrogen, argon, hydrogen, helium and mixtures thereof. The preferred carrier gas comprises nitrogen.

The present invention is particularly advantageous because the precursor mixture may be mixed without unacceptable pre-reaction, thereby preventing blockages of any apparatus used in the method of the invention.

Thus, the present invention accordingly provides, in a second aspect, a chemical vapour deposition precursor mixture suitable for use according to the first aspect of the present invention comprising: dialkyl zinc, a phosphorus source, and optionally an ester, the phosphorus source comprising a compound of formula $O_nP(OR^3)_3$, wherein n is 0 or 1 and each $R^3$ is hydrocarbyl.

All features discussed in relation to the first aspect of the present invention also apply accordingly in respect of the second aspect of the present invention.

The present invention also provides, in a third aspect, a coated glass article, comprising: a glass substrate; a silica coating deposited on the glass substrate; a zinc oxide coating deposited over the silica coating by a method according to the first aspect of the invention.

All features discussed in relation to the first aspect of the present invention apply accordingly in respect of the third aspect of the present invention.

One use of zinc oxide coated glass substrates (especially when coated on at transparent conductive oxide coating) is in photovoltaic (PV) cells.

Thus, the present invention accordingly provides, in a fourth aspect, a photovoltaic cell comprising a coated glass article having a zinc oxide coating deposited over a transparent conductive oxide coating (for example, a fluorine doped tin oxide coating) by a method according to the first aspect. All features of the first aspect of the present invention therefore also apply accordingly in respect of the fourth aspect of the present invention.

BRIEF DESCRIPTION OF THE DRAWINGS

The present invention will now be described further with reference to the following examples and Figures in which.

DETAILED DESCRIPTION OF THE INVENTION

Figure 1:
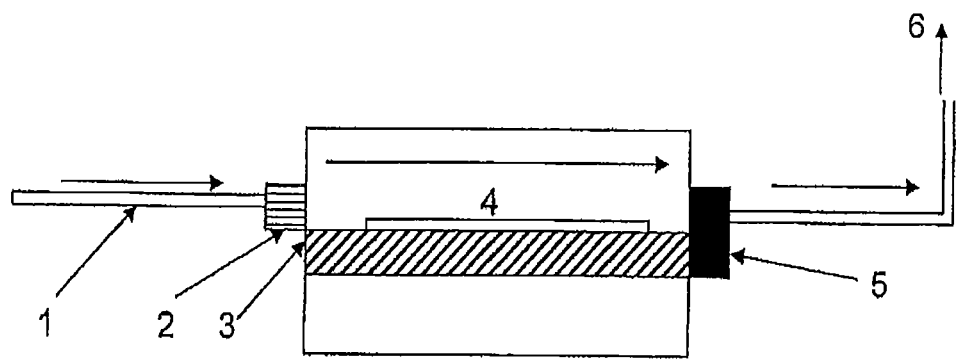
FIG. 1 shows schematically a static coater used for laboratory scale chemical vapour deposition experiments as used in the Comparative Examples and Examples according to the method of the present invention.

Referring to FIG. 1, processes for deposition of zinc oxide coatings on glass substrates in relation to the present invention were performed using a laboratory scale static coater. In the laboratory scale static coater, premixed precursors move towards the coater through a heated line 1 before reaching baffle section 2, which equalises the precursor flow before it enters the sealed coating section. The glass substrate 4 sits on a heated carbon block 3 which is heated to the desired temperature using either: heating elements (not shown) inserted inside the carbon block; or, by an induction coil (not shown) around the sealed coating section. Any unreacted precursor or by-products are then directed towards fish tail exhaust 5, and continue towards the incinerator 6. The arrows in FIG. 1 show the direction in which the gaseous mixture moves.

EXAMPLES

All experiments were carried out using a static coater as described in relation to FIG. 1. Diethyl zinc (DEZ) was used as the zinc precursor and either ethyl acetate ($CH_3COOCH_2CH_3$), or t-butyl acetate ($CH_3COOC(CH_3)_3$) served as the oxygen source. Zinc oxide (ZnO) films (also referred to herein as layers) were obtained. Esters (including ethyl acetate (EtOAc) and t-butyl acetate (tBuOAc)) were found to be efficient oxidants for the process, speeding the reaction and producing thick films, and allowing pre-mixing in the presence of the phosphorus with alkyl zinc compounds without premature pre-reaction or excessive powder formation.

The precursors were delivered in a nitrogen carrier gas via vessels/bubblers with a total flow rate of about 12 standard litres per minute (slm) to 13 standard litres per minute (slm) (litres $min^{-1}$, at standard temperature and pressure, (stp)). Delivery lines were maintained at a temperature of about 150° C. to avoid condensation.

Comparative Examples A to F and Examples 1 to 35

In the Examples and Comparative Examples, t-butyl acetate was added as oxidant. In the Comparative Examples, no triethyl phosphite was used.

The substrate for Comparative Example F and Examples 5, 7, 11 and 34 was float glass coated with a transparent conductive oxide having the film sequence: glass/tin oxide, silicon dioxide/fluorine doped tin oxide (glass/$SnO_2$/$SiO_2$/$SnO_2$:F) (available from NSG). The substrate for all the other Comparative Examples and Examples was float glass having a coating of silica approximately 25 nm thick.

During deposition for each sample, the diethyl zinc (DEZ) vessel temperature (° C.) was between 67° C. and 75° C. and the DEZ carrier gas flow in litres per minute (L $min^{-1}$) at standard temperature and pressure, (stp) was between 0.44 L $min^{-1}$ and 0.80 L $min^{-1}$. The triethyl phosphite ($P(OCH_2CH_3)_3$), vessel temperature (° C.) was 64° C. or 65° C. and, for the Examples, the triethyl phosphite carrier gas flow rate in litres per minute (L $min^{-1}$) at standard temperature and pressure (stp) was between 0.05 L $min^{-1}$ and 0.55 L $min^{-1}$.

The oxidant was supplied through a syringe, and the oxidant was injected into a carrier gas having a flow rate of 5.00 L $min^{-1}$ (at standard temperature and pressure (stp)).

Further details of the zinc oxide deposition for Comparative Examples A to F and Examples 1 to 35 are provided in Table 1. The molar ratios of diethyl zinc (DEZ) to triethyl phosphite, diethyl zinc (DEZ) to oxidant and triethyl phosphite to oxidant are provided in Table 2, together with approximate values for the thickness of the coated layer of zinc oxide for some of the samples.

The thickness of the deposited zinc oxide layer in the examples was determined by examining the interference reflection colour of the coating at the thickest position and estimating the thickness, assuming a refractive index of 1.8.

The Examples show that a thicker zinc oxide layer is deposited when a phosphorus source, in the form of triethyl phosphite, is added to the precursor mixture compared to the Comparative Examples without triethyl phosphite (when the DEZ amount is the same).

When the zinc precursor flow rate is approximately constant, the addition of triethyl phosphite improved the deposition efficiency and in so doing also reduced the waste particulates generated. The X-ray photoelectron spectroscopy (XPS) results (described below and illustrated in FIGS. 2 to 4) show that there was very little or no phosphorus incorporation in the layers and that the layers had a stoichiometry close to ZnO. As discussed herein, a further advantage of the use of triethyl phosphite in the precursor mixture is in reducing the amount of powder generation, and significantly increasing the stability of the precursor mixture.

In addition, as the amount of triethyl phosphite in the precursor mixture is increased, the thickness of the zinc oxide coating layer obtained also generally increases. The quantity of triethyl phosphite required to produce a thickness increase is small with an increase seen at just 2% of the DEZ concentration. When the amount of triethyl phosphite is increased to 15% of the DEZ concentration, absorption was seen in the zinc oxide coating layer, indicating that the deposition rate was high enough to enable a fully oxidised zinc oxide layer to be produced at the amount of oxidant used. The use of greater amounts of oxidant is likely to lead to a fully oxidised layer.

Some of the Examples investigated whether the underlying substrate had an influence on the zinc oxide layer (or film) growth by using a glass substrate bearing a transparent conductive coating as seen in Comparative Examples F and Examples 5, 7, 11 and 34. The thickness of the zinc oxide layer was determined by looking at the reflection colour. The data provided by the examples confirms that a similar improvement in the thickness of the zinc oxide layer is achieved by adding triethyl phosphite when a transparent conductive coated substrate is used as when using a silica coated glass substrate.

TABLE 1

| Example or Comparative Example (CE) | Reactor Temp (° C.) | DEZ Carrier Gas Flow (L / min) | DEZ vessel T (° C.) | Triethyl Phosphite Carrier Gas Flow (L/min) | Triethyl Phosphite vessel T (° C.) | Oxidant supply ($cm^3$/hr) | Run Time (s) |
|---|---|---|---|---|---|---|---|
| CE A | 600 | 0.75 | 69.0 | 0.00 | — | 100 | 30 |
| CE B | 600 | 0.80 | 67.0 | 0.00 | — | 100 | 30 |
| CE C | 600 | 0.80 | 68.0 | 0.00 | — | 100 | 30 |
| CE D | 600 | 0.71 | 70.0 | 0.00 | — | 100 | 30 |
| CE E | 600 | 0.61 | 73.0 | 0.00 | — | 100 | 30 |
| CE F* | 600 | 0.64 | 72.0 | 0.00 | — | 100 | 30 |
| 1 | 600 | 0.60 | 72.0 | 0.05 | 65.0 | 96 | 30 |
| 2 | 600 | 0.60 | 72.0 | 0.05 | 65.0 | 96 | 30 |
| 3 | 600 | 0.64 | 72.0 | 0.06 | 64.0 | 100 | 30 |
| 4 | 600 | 0.80 | 68.0 | 0.06 | 65.0 | 100 | 30 |
| 5* | 600 | 0.64 | 72.0 | 0.06 | 65.0 | 100 | 30 |
| 6 | 600 | 0.70 | 70.0 | 0.14 | 65.0 | 100 | 30 |
| 7* | 600 | 0.64 | 72.0 | 0.14 | 65.0 | 100 | 30 |
| 8 | 600 | 0.50 | 75.0 | 0.23 | 65.0 | 85 | 30 |
| 9 | 600 | 0.60 | 71.0 | 0.25 | 65.0 | 85 | 30 |
| 10 | 600 | 0.75 | 69.0 | 0.28 | 65.0 | 100 | 30 |
| 11* | 600 | 0.64 | 72.0 | 0.28 | 65.0 | 100 | 30 |
| 12 | 625 | 0.61 | 73.0 | 0.28 | 65.0 | 100 | 8 |
| 13 | 625 | 0.68 | 71.0 | 0.28 | 65.0 | 100 | 9 |
| 14 | 600 | 0.61 | 73.0 | 0.28 | 65.0 | 100 | 10 |
| 15 | 625 | 0.71 | 70.0 | 0.28 | 65.0 | 100 | 5 |
| 16 | 625 | 0.61 | 73.0 | 0.28 | 65.0 | 100 | 10 |
| 17 | 600 | 0.64 | 72.0 | 0.28 | 65.0 | 100 | 15 |
| 18 | 600 | 0.71 | 70.0 | 0.28 | 65.0 | 100 | 9 |
| 19 | 475 | 0.64 | 72.0 | 0.28 | 65.0 | 100 | 60 |
| 20 | 475 | 0.71 | 70.0 | 0.28 | 65.0 | 100 | 60 |
| 21 | 475 | 0.64 | 72.0 | 0.28 | 65.0 | 100 | 90 |
| 22 | 450 | 0.64 | 72.0 | 0.28 | 65.0 | 100 | 120 |
| 23 | 425 | 0.58 | 74.0 | 0.28 | 65.0 | 100 | 120 |
| 24 | 575 | 0.64 | 72.0 | 0.28 | 65.0 | 100 | 10 |
| 25 | 550 | 0.61 | 73.0 | 0.28 | 65.0 | 100 | 12 |
| 26 | 525 | 0.71 | 70.0 | 0.28 | 65.0 | 100 | 14 |
| 27 | 525 | 0.71 | 70.0 | 0.28 | 65.0 | 100 | 16 |
| 28 | 500 | 0.68 | 71.0 | 0.28 | 65.0 | 100 | 19 |
| 29 | 500 | 0.68 | 71.0 | 0.28 | 65.0 | 100 | 24 |
| 30 | 500 | 0.71 | 70.0 | 0.28 | 65.0 | 100 | 30 |
| 31 | 500 | 0.75 | 69.0 | 0.28 | 65.0 | 100 | 50 |
| 32 | 600 | 0.55 | 69.0 | 0.41 | 65.0 | 73 | 30 |
| 33 | 600 | 0.75 | 69.0 | 0.55 | 65.0 | 100 | 30 |
| 34* | 600 | 0.64 | 72.0 | 0.55 | 65.0 | 100 | 30 |
| 35 | 600 | 0.44 | 69.0 | 0.64 | 65.0 | 58 | 30 |

* Substrate is float glass coated with a transparent conductive oxide

TABLE 2

| Example or Comparative Example (CE) | Molar Ratio DEZ:Triethyl Phosphite | Molar Ratio DEZ:Oxidant | Molar Ratio Triethyl Phosphite:Oxidant | Thickness Estimate of Zinc Oxide layer (nm) |
|---|---|---|---|---|
| CE A | 0.000 | 2.14 | 0.00 | 350-410 |
| CE B | 0.000 | 2.18 | 0.00 | 260-300 |
| CE C | 0.000 | 2.09 | 0.00 | 430-520 |
| CE D | 0.000 | 2.17 | 0.00 | 205-230 |
| CE E | 0.000 | 2.24 | 0.00 | 160-180 |
| CE F* | 0.000 | 2.22 | 0.00 | 260-300 |

TABLE 2-continued

| Example or Comparative Example (CE) | Molar Ratio DEZ:Triethyl Phosphite | Molar Ratio DEZ:Oxidant | Molar Ratio Triethyl Phosphite:Oxidant | Thickness Estimate of Zinc Oxide layer (nm) |
|---|---|---|---|---|
| 1 | 0.018 | 2.28 | 129.64 | 260-300 |
| 2 | 0.018 | 2.27 | 128.94 | 300-320 |
| 3 | 0.019 | 2.22 | 117.04 | 160-180 |
| 4 | 0.019 | 2.09 | 111.93 | 300-320 |
| 5* | 0.020 | 2.22 | 111.93 | 350-410 |
| 6 | 0.046 | 2.20 | 47.97 | 230-260 |
| 7* | 0.046 | 2.22 | 47.97 | 410-430 |
| 8 | 0.086 | 2.14 | 24.82 | 205-230 |
| 9 | 0.092 | 2.10 | 22.83 | 300-320 |
| 10 | 0.089 | 2.14 | 23.98 | 430-520 |
| 11* | 0.093 | 2.22 | 23.98 | 430-520 |
| 12 | 0.093 | 2.24 | 23.98 | — |
| 13 | 0.091 | 2.18 | 23.98 | 70-100 |
| 14 | 0.093 | 2.24 | 23.98 | — |
| 15 | 0.091 | 2.17 | 23.98 | — |
| 16 | 0.093 | 2.24 | 23.98 | 70-100 |
| 17 | 0.093 | 2.22 | 23.98 | 160-180 |
| 18 | 0.091 | 2.17 | 23.98 | 70 |
| 19 | 0.093 | 2.22 | 23.98 | 70 |
| 20 | 0.091 | 2.17 | 23.98 | — |
| 21 | 0.093 | 2.22 | 23.98 | — |
| 22 | 0.093 | 2.22 | 23.98 | — |
| 23 | 0.094 | 2.26 | 23.98 | — |
| 24 | 0.093 | 2.22 | 23.98 | — |
| 25 | 0.093 | 2.24 | 23.98 | — |
| 26 | 0.091 | 2.17 | 23.98 | — |
| 27 | 0.091 | 2.17 | 23.98 | — |
| 28 | 0.091 | 2.18 | 23.98 | — |
| 29 | 0.091 | 2.18 | 23.98 | — |
| 30 | 0.091 | 2.17 | 23.98 | — |
| 31 | 0.089 | 2.14 | 23.98 | 100-130 |
| 32 | 0.178 | 2.13 | 11.96 | 180-205 |
| 33 | 0.175 | 2.14 | 12.21 | 350-410 |
| 34* | 0.182 | 2.22 | 12.21 | 350-410 |
| 35 | 0.348 | 2.12 | 6.09 | 70-100 |

*Substrate is float glass coated with a transparent conductive oxide

In Table 2, the thickness of the zinc oxide layer (in nm) was estimated based on colour interference fringes seen on the substrate after deposition. Below 70 nm, layers (or films) are colourless and the thickness cannot be estimated in the same way.

Comparative Examples G to K and Examples 36 to 48

Experiments were undertaken to investigate how the oxidant affected the zinc oxide layer (or film) growth. The conditions used for these Examples and Comparative Examples were generally similar to those used for Examples 1 to 35 but using ethyl acetate as the oxidant.

The substrate for Comparative Example K and Examples 38, 41, 44 and 47 was float glass coated with a transparent conductive oxide having the sequence: glass/tin oxide, silicon dioxide/fluorine doped tin oxide (glass/$SnO_2$/$SiO_2$/$SnO_2$:F) (available from NSG). The substrate for the other Comparative Examples and Examples was float glass having a coating of silica approximately 25 nm thick.

During the zinc oxide layer depositions, the diethyl zinc (DEZ) vessel temperature (° C.) was between 73° C. and 85° C., and the DEZ carrier flow in litres per minute (L min$^{-1}$), at standard temperature and pressure (stp) was between 0.63 L min$^{-1}$ and 1.20 L min$^{-1}$. The triethyl phosphite vessel temperature (° C.) was 64° C., 65° C. or 69° C. and the triethyl phosphite carrier flow in litres per minute (L min$^{-1}$), for the Examples, was between 0.11 L min$^{-1}$ and 1.17 L min$^{-1}$. The oxidant, ethyl acetate ($CH_3COOCH_2CH_3$) was supplied through a syringe, injecting the oxidant into a carrier gas at a flow rate of 5.00 L min$^{-1}$ at standard temperature and pressure (stp).

Further details of the deposition of the zinc oxide layer for Comparative Examples G to K and Examples 36 to 48 are given in Table 3. The molar ratios of DEZ to triethyl phosphite and DEZ to oxidant are given in Table 4 together with the approximate thickness of the zinc oxide coating.

The thickness was determined by examining the interference reflection colour of the zinc oxide coating at the thickest position and estimating the thickness assuming a refractive index of 1.8.

The results show an improved deposition efficiency as the amount of triethyl phosphite is increased. Even with an increased flow of ethyl acetate, the zinc oxide coatings were still slightly thinner for Examples 36 to 48, compared with the Examples using tertbutylacetate as oxidant. This indicates that ethyl acetate and tertbutylacetate may both be used as effective oxidants.

TABLE 3

| Example or Comparative Example (CE) | Reactor Temp (° C.) | DEZ Carrier Gas Flow (L/min) | DEZ vessel T (° C.) | TEP Carrier Gas Flow (L/min) | TEP vessel T (° C.) | Oxidant Amount (cm$^3$/hr) | Run Time (s) |
|---|---|---|---|---|---|---|---|
| CE G | 600 | 0.65 | 85.0 | 0.00 | — | 200 | 30 |
| CE H | 600 | 0.85 | 80.0 | 0.00 | — | 200 | 30 |
| CE I | 600 | 1.00 | 77.0 | 0.00 | — | 200 | 30 |
| CE J | 600 | 0.95 | 78.0 | 0.00 | — | 200 | 30 |
| CE K* | 600 | 1.17 | 74.0 | 0.00 | — | 200 | 30 |
| 36 | 600 | 1.20 | 73.0 | 0.11 | 65.0 | 194 | 30 |
| 37 | 600 | 1.11 | 75.0 | 0.11 | 65.0 | 200 | 30 |
| 38* | 600 | 0.85 | 80.0 | 0.11 | 65.0 | 200 | 30 |
| 39 | 600 | 0.75 | 82.0 | 0.12 | 64.0 | 194 | 30 |
| 40 | 600 | 1.05 | 76.0 | 0.28 | 65.0 | 200 | 30 |
| 41* | 600 | 0.90 | 79.0 | 0.28 | 65.0 | 200 | 30 |
| 42 | 600 | 0.83 | 78.0 | 0.48 | 65.0 | 175 | 30 |
| 43 | 600 | 1.05 | 76.0 | 0.55 | 65.0 | 200 | 30 |
| 44* | 600 | 0.95 | 78.0 | 0.55 | 65.0 | 200 | 30 |
| 45 | 600 | 0.82 | 76.0 | 0.86 | 65.0 | 155 | 30 |
| 46 | 600 | 1.00 | 77.0 | 1.10 | 65.0 | 200 | 30 |
| 47* | 600 | 1.11 | 75.0 | 1.11 | 65.0 | 200 | 30 |
| 48 | 600 | 0.63 | 77.0 | 1.17 | 69.0 | 126 | 30 |

*Substrate float glass coated with a transparent conductive oxide

TABLE 4

| Example or Comparative Example (CE) | Ratio DEZ:Triethyl Phosphite | Ratio DEZ:Oxidant | Molar Ratio TEP:Oxidant | Thickness Estimate of Zinc Oxide layer (nm) |
|---|---|---|---|---|
| CE G | 0.000 | 2.44 | 0.00 | 100-130 |
| CE H | 0.000 | 2.45 | 0.00 | 160-180 |
| CE I | 0.000 | 2.44 | 0.00 | 205-230 |
| CE J | 0.000 | 2.44 | 0.00 | 180-205 |
| CE K* | 0.000 | 2.43 | 0.00 | 230-260 |
| 36 | 0.102 | 2.42 | 23.79 | 300-320 |
| 37 | 0.099 | 2.43 | 24.52 | 205-230 |
| 38* | 0.100 | 2.45 | 24.52 | 205-230 |
| 39 | 0.106 | 2.42 | 22.77 | 100-130 |
| 40 | 0.254 | 2.44 | 9.63 | 205-230 |
| 41* | 0.253 | 2.44 | 9.63 | 230 |
| 42 | 0.496 | 2.44 | 4.92 | 160-180 |
| 43 | 0.498 | 2.44 | 4.90 | 430-520 |
| 44* | 0.497 | 2.44 | 4.90 | 335-350 |
| 45 | 0.998 | 2.43 | 2.43 | 180-205 |
| 46 | 0.994 | 2.44 | 2.45 | 205-230 |
| 47* | 1.002 | 2.43 | 2.43 | 205-230 |
| 48 | 2.000 | 2.44 | 1.22 | 100-130 |

*Substrate float glass coated with a transparent conductive oxide

In Table 4, the thickness of the zinc oxide layer was estimated based on the colour interference fringes seen on the substrate after deposition. Below 70 nm layers (or films) are colourless and thickness cannot be estimated in the same way.

X-Ray Photoelectron Spectroscopy (XPS) Analysis

X ray photoelectron spectroscopy (XPS) was performed on Example 6, Example 33 and Comparative Example E.

Figure 2:
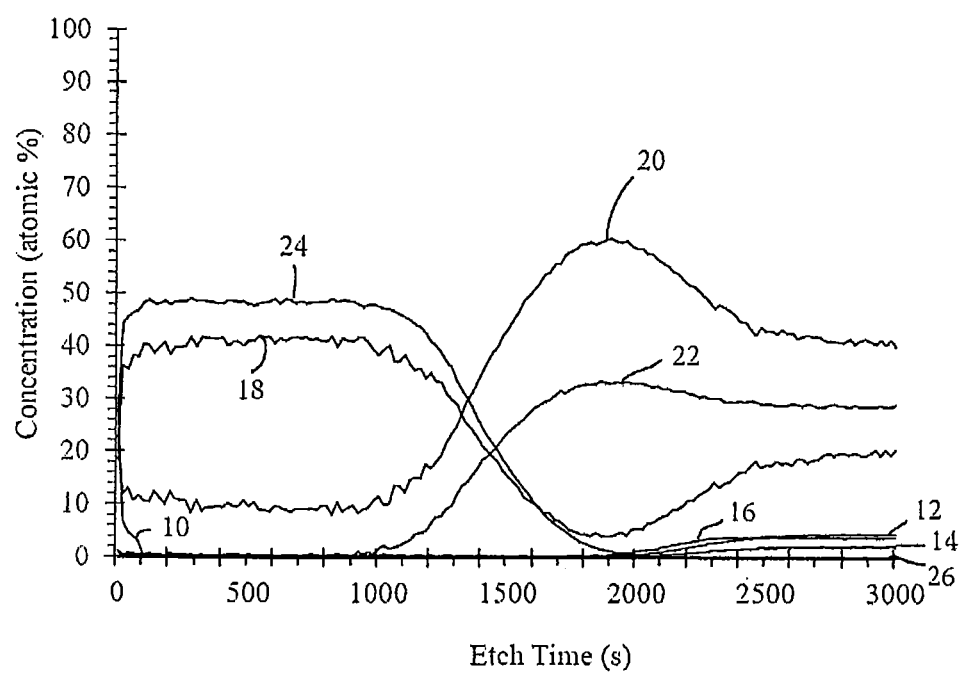
FIG. 2 shows a graph of the X-ray photoelectron spectroscopy (XPS) depth profile for Comparative Example E.
Figure 3:
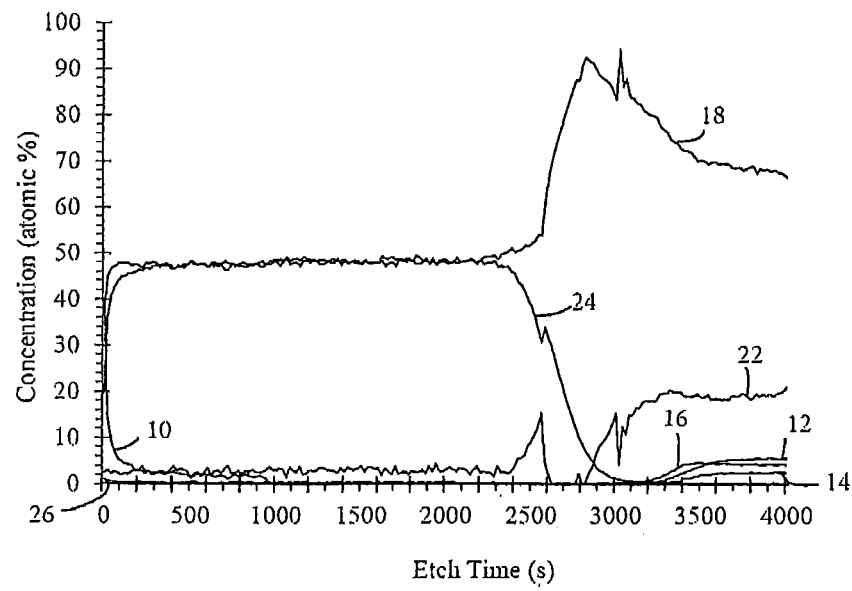
FIG. 3 shows a graph of the XPS depth profile for Example 6.
Figure 4:
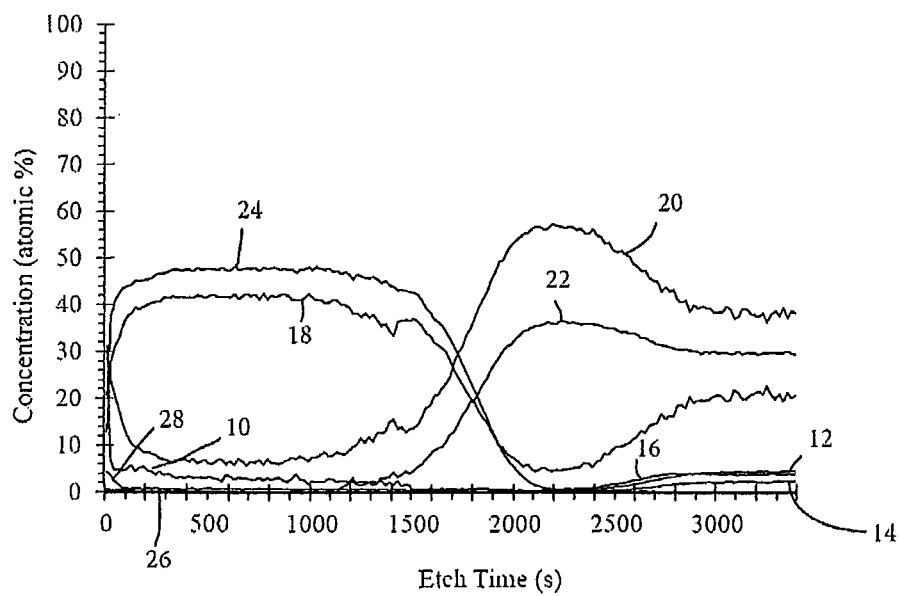
FIG. 4 shows XPS depth profile for Example 33.

XPS analysis was used to confirm the stoichiometry of the zinc oxide coating layers as ZnO. Chlorine was detected throughout the depth of all three samples. The value for Comparative Example E was 0.4 atomic % and for Examples 6 and 33, the value was 1 atomic %. Phosphorus was only detected within the silica layer of the transparent conductive oxide coating for sample Example 33 at around ~0.5 atomic %. The XPS results for the zinc oxide coating layers are shown in FIGS. 2, 3 and 4. In each of FIGS. 2, 3 and 4 the numbered curves refer to the species as indicated in Table 5, below. The numbered curves for FIGS. 10, 12, 14, 16 and 17 are also indicated in Table 5 below.

TABLE 5

| Reference Numeral assigned in FIGS. 2, 3, 4, 10, 12, 14, 16 and 17 | Assignment |
|---|---|
| 10 | C 1s |
| 12 | Ca 2p3 |
| 14 | Mg 1s |
| 16 | Na 1s |
| 18 | O 1s |
| 20 | O 1s Scan A |
| 21 | P 2p |
| 22 | Si 2p |
| 23 | Si 2p Scan A |
| 24 | Zn 2p3 |
| 26 | Cl 2p |
| 28 | P 2p |

Time of Flight Secondary Ion Mass Spectrometry (ToF-SIMS)

An ION-TOF 5 Time of Flight Secondary Ion Mass Spectrometry (ToF-SIMS) instrument was used to obtain a compositional positive ion depth profile for each coating. The analysis beam was $Bi^{3+}$ and the sputter beam was 1 keV $Cs^+$ with a beam current of 70.2 nA. For each sample tested, the sputter beam was rastered over a 200×200 µm area and the bismuth analysis beam was rastered over a 50×50 µm area at the centre of the sputtered region.

Only Example 33 provided a phosphorus signal response at just above the limit of detection.

Scanning Electron Microscopy (SEM)

Example 6, Example 33 and Comparative Example E were analysed by SEM.

Figure 5:
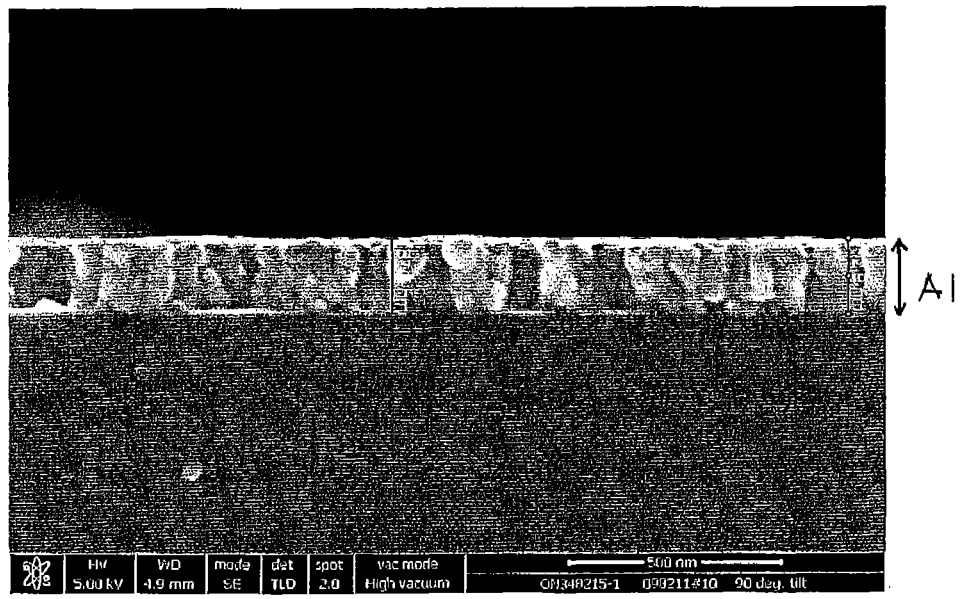
FIGS. 5 and 6 are scanning electron micrographs illustrating the thickness 'A1' of the zinc oxide layer for Comparative Example E.
Figure 6:
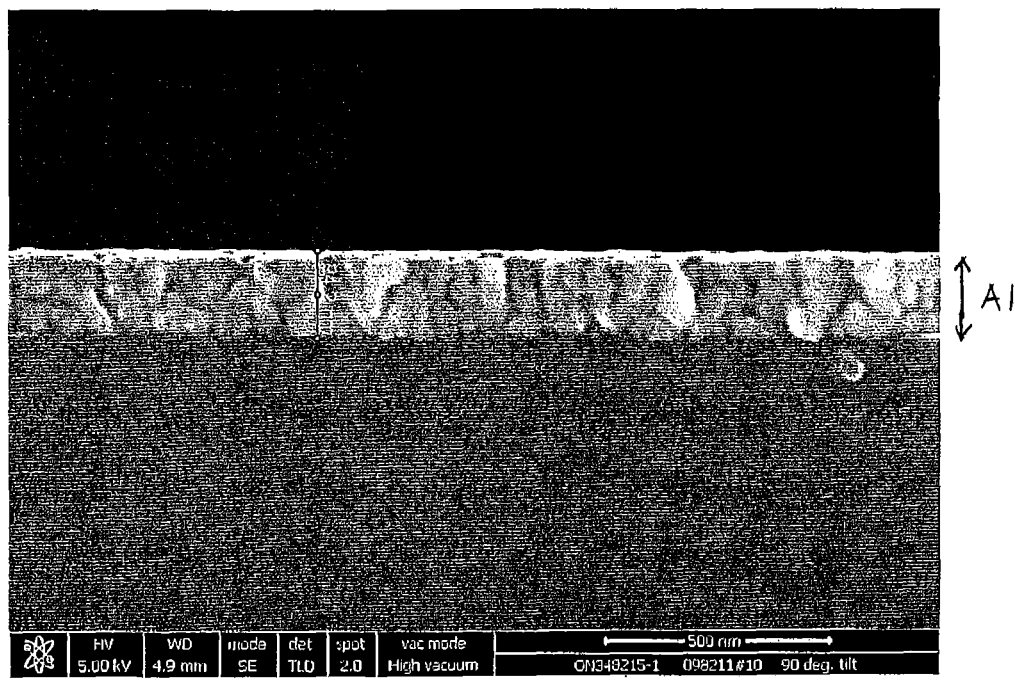

SEM was used to confirm the thickness of the zinc oxide layer for Comparative Example E, which was measured to be 187-194 nm, as illustrated in FIG. 5 and FIG. 6.

Figure 7:
FIGS. 7 and 8 are scanning electron micrographs illustrating the thickness 'A2' of the zinc oxide layer for Example 6.
Figure 8:
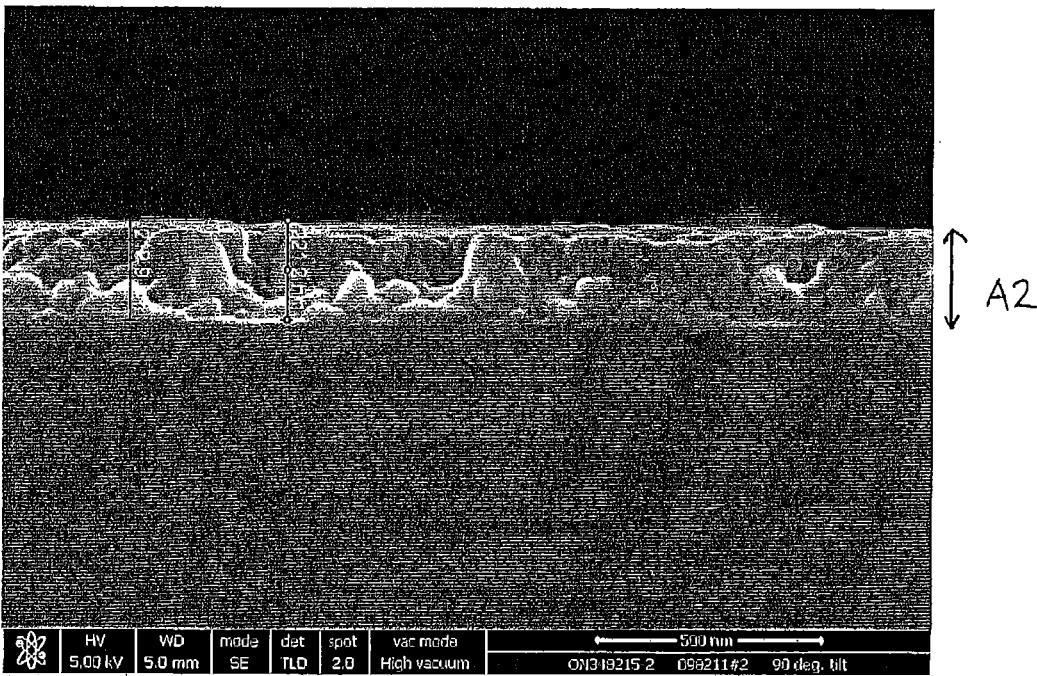

SEM was also used to confirm the thickness of the zinc oxide layer in Example 6, which was found to be 210-221 nm, as illustrated in FIG. 7 and FIG. 8.

Figure 9:
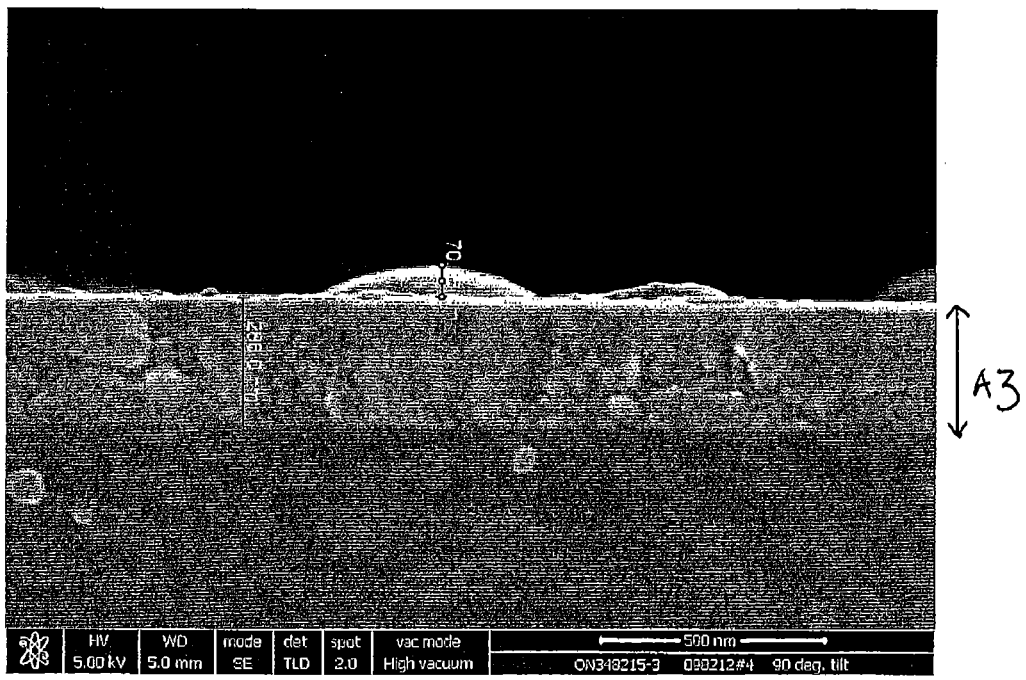
FIG. 9 is a scanning electron micrograph illustrating the thickness 'A3' of the zinc oxide layer in Example 33.

SEM was further used to confirm the thickness of the zinc oxide layer in Example 33, which was found to 286 nm, as shown in FIG. 9.

All 3 examples used the same amounts of diethyl zinc (DEZ) and tertbutylacetate (tBuOAc) in the precursor mixture. The only difference between the samples was the amount of triethyl phosphite used.

The results and images show that by adding a small amount of triethyl phosphite to the precursor mixture in accordance with the method of the present invention, the thickness of the zinc oxide layer deposited was increased by an amount of from 10 to 15%. In addition, it was found that by adding a larger amount of triethyl phosphite to the precursor mixture in accordance with the method of the present invention the thickness of the zinc oxide layer deposited could be increased by from 39 to 44%.

X-Ray Diffraction (XRD)

Example 6, Example 33 and Comparative Example E were analysed by XRD.

X-ray diffraction (XRD) was performed using a Bruker D8 Discover X-ray diffractometer using monochromatic Cu Kα1 and Cu Kα2 radiation of wavelengths 0.154056 and 0.154439 nm respectively, emitted with a voltage of 40 kV and a current of 40 mA in an intensity ratio of 2:1. Diffraction patterns were obtained by scanning the samples from 5 to 95° 2θ using an X'Celerator detector, allowing detection of crystalline phases in the first 1 to 10 microns of the sample surface. A scanning time of 1 hour per sample was used.

The coating in each case exhibited crystalline phases identified as zinc oxide (indexed to Zincite, ZnO, Hexagonal). Information on the XRD results is provided in Tables 6 to 9, below.

The crystallite size was approximately 9 to 18 nm (see Table 6 below). The crystallite size for Example 33 was smaller than that of the other samples. All the samples showed some preferred orientation in the (100) plane.

TABLE 6

| Sample | Reflection | Integral breadth (sample) | Integral breadth (std) | Peak position (2θ) | Crystallite size (nm) |
|---|---|---|---|---|---|
| Comparative Example E | (100) | 0.646 | 0.139 | 31.73 | 19 |
| | (101) | 0.608 | 0.138 | 36.21 | 21 |
| | (110) | 0.992 | 0.133 | 56.56 | 13 |
| | Average | — | — | — | 18 |
| Example 6 | (100) | 0.668 | 0.139 | 31.75 | 19 |
| | (101) | 0.701 | 0.138 | 36.23 | 18 |
| | (110) | 1.091 | 0.133 | 56.56 | 11 |
| | Average | — | — | — | 16 |

TABLE 6-continued

| Sample | Reflection | Integral breadth (sample) | Integral breadth (std) | Peak position (2θ) | Crystallite size (nm) |
|---|---|---|---|---|---|
| Example 33 | (100) | 1.066 | 0.139 | 31.66 | 11 |
| | (101) | 1.391 | 0.138 | 36.08 | 8 |
| | (110) | 1.445 | 0.133 | 56.43 | 8 |
| | Average | — | — | — | 9 |

In Table 6 there is provided details of the crystallite size of the zinc oxide layer for Comparative Example 5, Example 6 and Example 33.

TABLE 7

| {hkl} | Pos. Meas. (2 θ) | d-spacing [Å] | FWHM (2 θ) | Height [cts] | Rel. Int. Measured [%] | Rel. Int. ICDD [%] | I/Io |
|---|---|---|---|---|---|---|---|
| (100) | 31.73 | 2.8175 | 0.45 | 874 | 95.7 | 55.2 | 1.73 |
| (101) | 36.21 | 2.4788 | 0.48 | 913 | 100.0 | 100.0 | 1.00 |
| (110) | 56.56 | 1.6259 | 0.60 | 210 | 22.9 | 31.4 | 0.73 |

Table 7 details the peak parameters obtained by X-ray diffraction for Comparative Example E.

TABLE 8

| {hkl} | Pos. Meas. (2 θ) | d-spacing [Å] | FWHM (2 θ) | Height [cts] | Rel. Int. Measured [%] | Rel. Int. ICDD [%] | I/Io |
|---|---|---|---|---|---|---|---|
| (100) | 31.75 | 2.8164 | 0.49 | 2586 | 100.0 | 55.2 | 1.81 |
| (101) | 36.23 | 2.4776 | 0.64 | 424 | 16.4 | 100.0 | 0.16 |
| (110) | 56.56 | 1.6259 | 0.80 | 674 | 26.1 | 31.4 | 0.83 |

Table 8 details the peak parameters obtained by X-ray diffraction for Example 6.

TABLE 9

| {hkl} | Pos. Meas. (2 θ) | d-spacing [Å] | FWHM (2 θ) | Height [cts] | Rel. Int. Measured [%] | Rel. Int. ICDD [%] | I/Io |
|---|---|---|---|---|---|---|---|
| (100) | 31.66 | 2.8242 | 0.75 | 2078 | 100.0 | 55.2 | 1.81 |
| (101) | 36.08 | 2.4875 | 0.90 | 271 | 13.0 | 100.0 | 0.13 |
| (110) | 56.43 | 1.6294 | 1.15 | 629 | 30.3 | 31.4 | 0.96 |

Table 9 details the peak parameters obtained by X-ray diffraction for Example 33.

Experiments to Evaluate Alternative Phosphorus Sources.

Different phosphorus sources were investigated in the method of the present invention. The derivatives explored were: trimethyl phosphite (TMP), triisopropyl phosphite (TIP) and triethyl phosphate (TEPa). The different phosphorus containing precursors are illustrated in Table 10.

TABLE 10

| PHOSPHORUS PRECURSOR | STRUCTURE |
|---|---|
| Triethyl Phosphite | (structure shown) |
| Trimethyl Phosphite | (structure shown) |
| Triisopropyl Phosphite | (structure shown) |
| Triethyl Phosphate | (structure shown) |

Experiments were conducted again using a static coater as described above in relation to FIG. 1. Diethyl zinc (DEZ) was used as the zinc precursor and t-butyl acetate ($CH_3COOC(CH_3)_3$) served as the oxygen source. The phosphorus compounds identified in Table 10 were tested as part of the precursor mixture in the deposition of a zinc oxide (ZnO) layer.

The precursors were delivered in a nitrogen carrier gas via vessels/bubblers with a total flow rate of about 12 standard litres per minute (slm) to 13 standard litres per minute (slm), at standard temperature and pressure, (stp)). Delivery lines were maintained at a temperature in the region of about 150° C. to avoid condensation.

The experimental data obtained for each of the alternative phosphorus sources investigated as part of the precursor mixture according to the method of the present invention are illustrated in Tables 11 and Table 12.

Example 53, Example 74, and Example 77 were analysed by SEM and XPS. These Examples were chosen because a similar amount of diethyl zinc (DEZ), tertbutylacetate (tBuOAc) and phosphorus precursor were used for the deposition of the zinc oxide layer.

Figure 10:
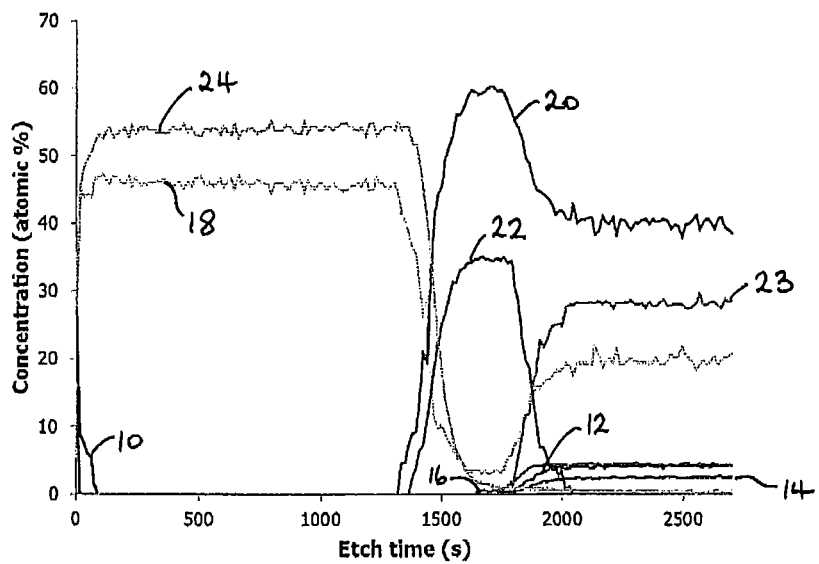
FIG. 10 is an x-ray photoelectron spectroscopy (XPS) depth profile for Example 74.
Figure 11:
FIG. 11 is a scanning electron micrograph (SEM) image of Example 74, for which the thickness of the zinc oxide layer is indicated by distance 'A4'.

Example 74 provides a baseline example of the deposition of zinc oxide (ZnO) using DEZ and tBuOAc. FIG. 10 is an x-ray photoelectron spectroscopy (XPS) trace for Example 74. FIG. 10 illustrates that the film (or layer) deposited comprises zinc atoms and oxygen atoms in the correct stoichiometry for ZnO, and in the absence of any phosphorus atoms. This is to be expected since no phosphorus containing chemicals were involved in the deposition of the zinc oxide layer. FIG. 11 is a scanning electron micrograph (SEM) image of Example 74, for which the thickness of the zinc oxide layer indicated by distance A, was found to be in the range of 267-287 nm.

Figure 12:
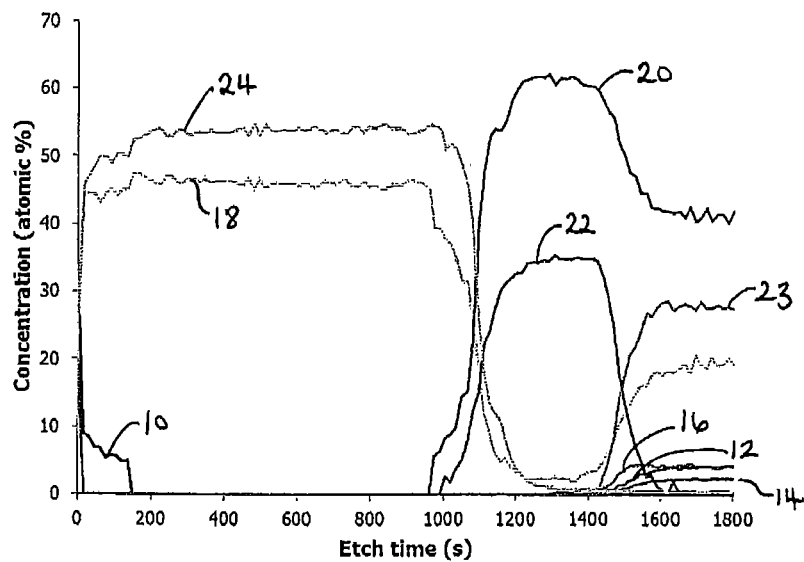
FIG. 12 is an x-ray photoelectron spectroscopy (XPS) depth profile for Example 53.
Figure 13:
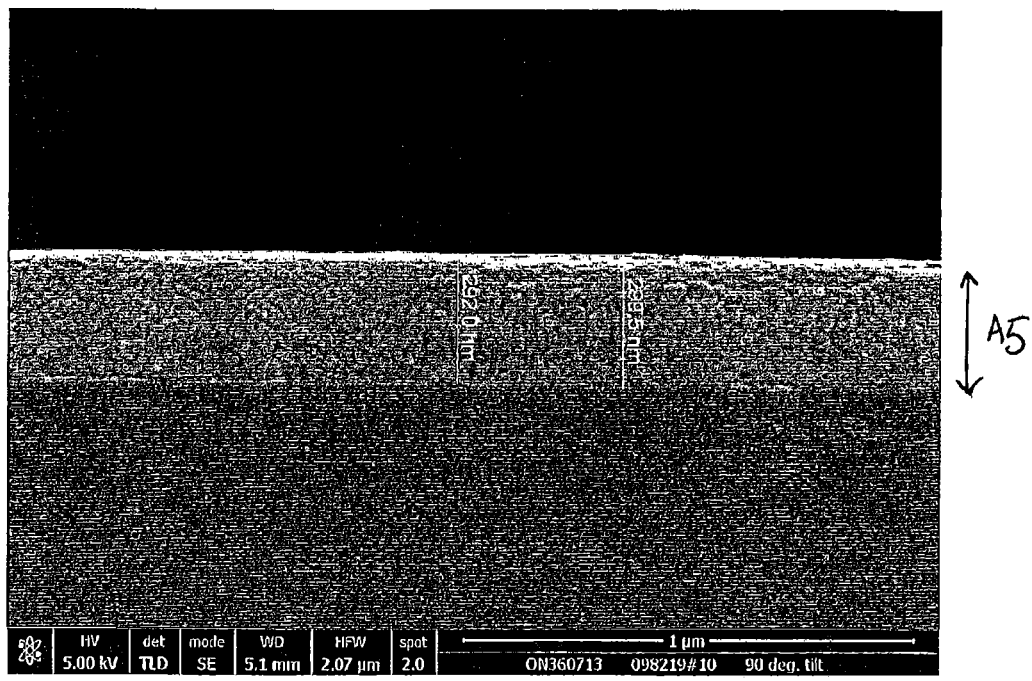
FIG. 13 is a scanning electron micrograph (SEM) image of Example 53, for which the thickness of the zinc oxide layer indicated by distance 'A5'.

Example 53 provides a zinc oxide (ZnO) layer deposited using diethyl zinc (DEZ), tertbutylacetate (tBuOAc) and trimethylphosphite (TMP). FIG. 12 is an x-ray photoelectron spectroscopy (XPS) trace of Example 53. FIG. 12 illustrates again that the coating layer deposited by the method of the present invention comprises zinc (Zn) atoms and oxygen atoms in the correct stoichiometry for ZnO. However, no phosphorus atoms were detected. That is, the results are similar to the results seen when using triethyl phosphite. FIG. 13 is a scanning electron micrograph (SEM) image of Example 53 confirming the thickness of the zinc oxide layer to be in the range of 292 to 300 nm. That is, in Example 53 there was observed an increase in the thickness of the zinc oxide layer of between 4 and 9%, compared to the thickness of the zinc oxide layer in Example 74. Therefore, it can be seen from Example 53 that trimethylphosphite (TMP) may also be used as a phosphorus source in the method of the present invention.

Figure 14:
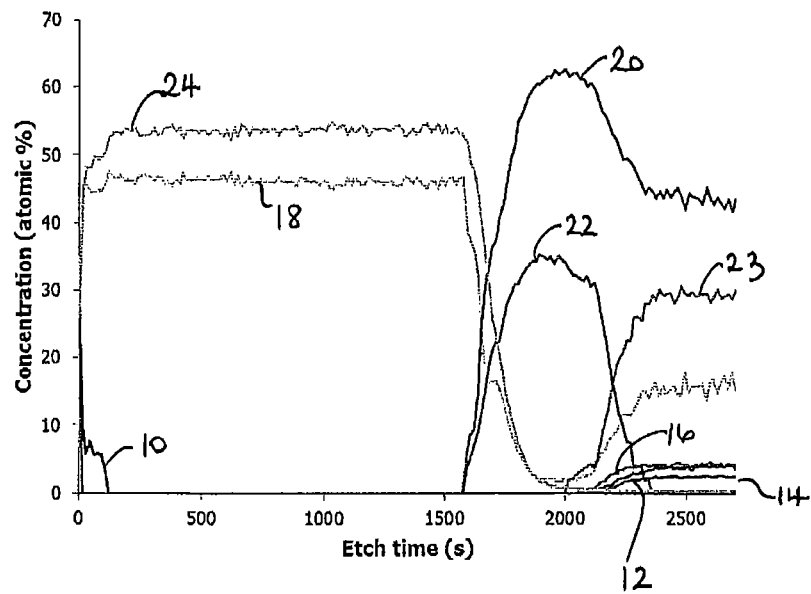
FIG. 14 is an x-ray photoelectron spectroscopy (XPS) depth profile for Example 77.
Figure 15:
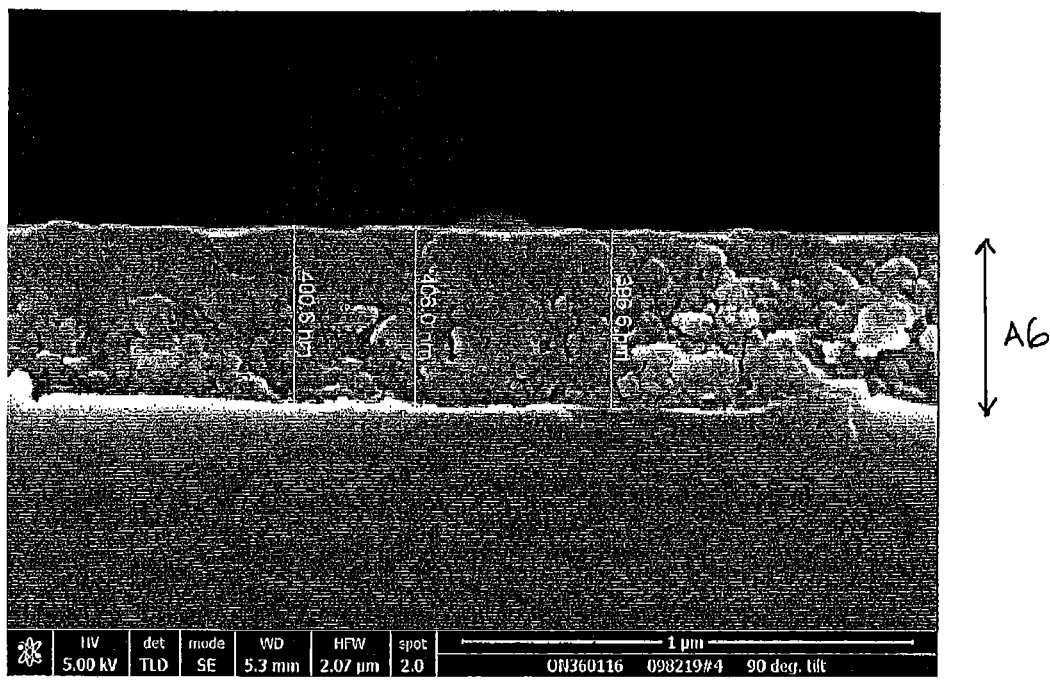
FIG. 15 is a scanning electron micrograph (SEM) image of Example 77, for which the thickness of the zinc oxide layer indicated by distance 'A6'.

In Example 77, a zinc oxide coating layer was deposited using diethyl zinc (DEZ), tertbutylacetate (tBuOAc) and triethylphosphate (TEPa). FIG. 14 is an x-ray photoelectron spectroscopy (XPS) trace of the zinc oxide later of Example 77. The x-ray photoelectron spectroscopy (XPS) trace, shows again that a zinc oxide film is deposited which comprises zinc atoms and oxygen atoms, in the correct stoichiometry for ZnO, in the absence of any phosphorus atoms. That is, similar results are seen for Example 77 when using triethyl phosphite. FIG. 15 is an SEM image of Example 77 confirming the thickness of the zinc oxide layer to be in the range of 396 to 406 nm. That is, there was an increase in the thickness of the zinc oxide layer in Example 77 of from 41 and 49% compared to the thickness of the zinc oxide layer obtained in Example 74. These results indicate that triethylphosphate (TEPa) may also be used as a phosphorus source for the deposition of a zinc oxide layer according to the method of the present invention.

Experiments were carried out using triisopropyl phosphite (tripropan-2-yl phosphite) (TIP), as shown in Table 11. The relevant vapour pressure data was not available, and hence, a comparison between the efficiency of the samples could not be made. However, the experiments still showed that it is possible to deposit a zinc oxide coating using triisopropyl phosphite (TIP).

TABLE 11

Table 11 provides details of the experiments performed in accordance with the method of the present invention using alternative phosphorus sources in the precursor mixture.

| Example or Comparative Example (CE) | Phosphorus Precursor Used | Reactor Temperature (°C.) | DEZ Carrier Gas Flow (L/min) | DEZ Vessel T (°C.) | Phosphorus Precursor Carrier Gas Flow (L/min) | Phosphorus Precursor Vessel T (°C.) | Oxidant Supply ($cm^3$/hr) | Run Time (s) |
|---|---|---|---|---|---|---|---|---|
| 49 | TMP | 600 | 0.58 | 74.0 | 0.00 | 0.0 | 100.00 | 30 |
| 50 | TMP | 600 | 0.61 | 73.0 | 0.00 | 0.0 | 100.00 | 30 |
| 51 | TMP | 600 | 0.64 | 72.0 | 0.05 | 29.0 | 100.00 | 30 |
| 52 | TMP | 600 | 0.64 | 72.0 | 0.15 | 29.0 | 100.00 | 30 |
| 53* | TMP | 600 | 0.64 | 72.0 | 0.30 | 29.0 | 100.00 | 30 |
| 54* | TMP | 600 | 0.64 | 72.0 | 0.59 | 29.0 | 100.00 | 30 |
| 55* | TMP | 600 | 0.64 | 72.0 | 0.15 | 29.0 | 100.00 | 30 |
| 56 | TMP | 600 | 0.68 | 71.0 | 0.00 | 0.0 | 100.00 | 30 |
| 57 | TMP | 600 | 0.64 | 72.0 | 0.30 | 29.0 | 100.00 | 30 |
| 58 | TMP | 600 | 0.70 | 72.0 | 0.00 | 20.0 | 100.00 | 30 |
| 59 | TMP | 600 | 0.70 | 72.0 | 0.00 | 20.0 | 100.00 | 30 |
| 60 | TMP | 600 | 0.70 | 72.0 | 1.00 | 30.0 | 0.00 | 30 |
| 61 | TMP | 600 | 0.70 | 72.0 | 1.00 | 81.0 | 0.00 | 30 |
| 62 | TMP | 600 | 0.70 | 72.0 | 2.00 | 81.0 | 0.00 | 30 |
| 63 | TMP | 600 | 0.70 | 72.0 | 2.00 | 81.0 | 10.00 | 30 |
| 64 | TMP | 600 | 0.70 | 72.0 | 0.06 | 81.0 | 100.00 | 30 |
| 65 | TMP | 600 | 0.70 | 72.0 | 2.00 | 81.0 | 0.00 | 30 |
| 66 | TMP | 600 | 0.70 | 72.0 | 2.00 | 81.0 | 10.00 | 30 |
| 67 | TMP | 600 | 0.70 | 72.0 | 0.06 | 81.0 | 100.00 | 30 |
| 68 | TIP | 600 | 0.58 | 74.0 | 0.50 | 26.0 | 100.00 | 30 |
| 69 | TIP | 600 | 0.58 | 74.0 | 0.50 | 34.0 | 100.00 | 30 |
| 70 | TIP | 600 | 0.61 | 73.0 | 0.50 | 46.0 | 100.00 | 30 |
| 71 | TIP | 600 | 0.58 | 74.0 | 0.50 | 55.0 | 100.00 | 30 |
| 72 | TIP | 600 | 0.58 | 74.0 | 0.25 | 57.0 | 100.00 | 30 |
| 73 | TIP | 600 | 0.58 | 74.0 | 1.00 | 55.0 | 100.00 | 30 |
| 74 | TEPa | 600 | 0.68 | 71.0 | 0.00 | 0.0 | 100.00 | 30 |
| 75 | TEPa | 600 | 0.68 | 71.0 | 0.05 | 113.0 | 100.00 | 30 |
| 76 | TEPa | 600 | 0.71 | 70.0 | 0.14 | 114.0 | 100.00 | 30 |
| 77 | TEPa | 600 | 0.71 | 70.0 | 0.28 | 114.0 | 100.00 | 30 |
| 78 | TEPa | 600 | 0.75 | 69.0 | 0.54 | 114.0 | 100.00 | 30 |
| 79 | TEPa | 600 | 0.64 | 72.0 | 0.28 | 114.0 | 100.00 | 30 |
| 80 | TEPa | 600 | 0.64 | 72.0 | 0.28 | 114.0 | 100.00 | 30 |
| 81 | TEPa | 600 | 0.71 | 70.0 | 0.28 | 114.0 | 100.00 | 30 |

*Substrate is float glass coated with a transparent conductive oxide

TABLE 12

Table 12 provides the ratios of the components in the precursor mixture for the deposition of a layer of zinc oxide according to the present invention using alternative phosphorus sources.

| Example or Comparative Example (CE) | Molar Ratio DEZ:Phosphorus Precursor | Molar Ratio DEZ:Oxidant | Molar Ratio Phosphorus precursor:Oxidant |
|---|---|---|---|
| 49 | 0.000 | 1.782 | 0.000 |
| 50 | 0.000 | 1.783 | 0.000 |
| 51 | 0.014 | 1.788 | 123.454 |
| 52 | 0.043 | 1.788 | 41.151 |
| 53* | 0.087 | 1.788 | 20.576 |
| 54* | 0.171 | 1.788 | 10.462 |
| 55* | 0.043 | 1.788 | 41.151 |
| 56 | 0.000 | 1.770 | 0.000 |
| 57 | 0.087 | 1.788 | 20.576 |
| 58 | 0.000 | 2.029 | 0.000 |
| 59 | 0.000 | 2.029 | 0.000 |

TABLE 12-continued

Table 12 provides the ratios of the components in the precursor mixture for the deposition of a layer of zinc oxide according to the present invention using alternative phosphorus sources.

| Example or Comparative Example (CE) | Molar Ratio DEZ:Phosphorus Precursor | Molar Ratio DEZ:Oxidant | Molar Ratio Phosphorus precursor:Oxidant |
|---|---|---|---|
| 60 | 0.330 | 0.000 | 0.000 |
| 61 | 2.992 | 0.000 | 0.000 |
| 62 | 5.983 | 0.000 | 0.000 |
| 63 | 5.983 | 0.203 | 0.034 |
| 64 | 0.179 | 2.029 | 11.304 |
| 65 | 5.983 | 0.000 | 0.000 |
| 66 | 5.983 | 0.203 | 0.034 |
| 67 | 0.179 | 2.029 | 11.304 |
| 74 | 0.000 | 1.770 | 0.000 |
| 75 | 0.013 | 1.770 | 134.559 |
| 76 | 0.039 | 1.782 | 46.071 |
| 77 | 0.077 | 1.782 | 23.035 |
| 78 | 0.149 | 1.774 | 11.944 |
| 79 | 0.078 | 1.788 | 23.035 |
| 80 | 0.078 | 1.788 | 23.035 |
| 81 | 0.077 | 1.782 | 23.035 |

*Substrate is float glass coated with a transparent conductive oxide

Investigating the Presence of Phosphorus in Zinc Oxide Layers

In the experiments discussed so far, all of the zinc oxide layers deposited had little (~0.5 atomic %) to no phosphorus inclusion in the layers. This was found to be in contrast to the results analysed for analogous experiments performed by the inventors and described in WO2015177552, which investigated the deposition of zinc oxide layers using dimethylsulfoxide as part of the precursor mixture. In the experiments which used dimethylsulfoxide as part of the precursor mixture, all of the zinc oxide layers appeared to contain sulphur.

Two samples 82 and 83, were prepared and analysed in which no oxidant was used and for which diethyl zinc (DEZ) and triethyl phosphite were mixed together in the precursor mixture. The experimental conditions used for examples 82 and 83 are shown in Table 13 and Table 14.

Figure 16:
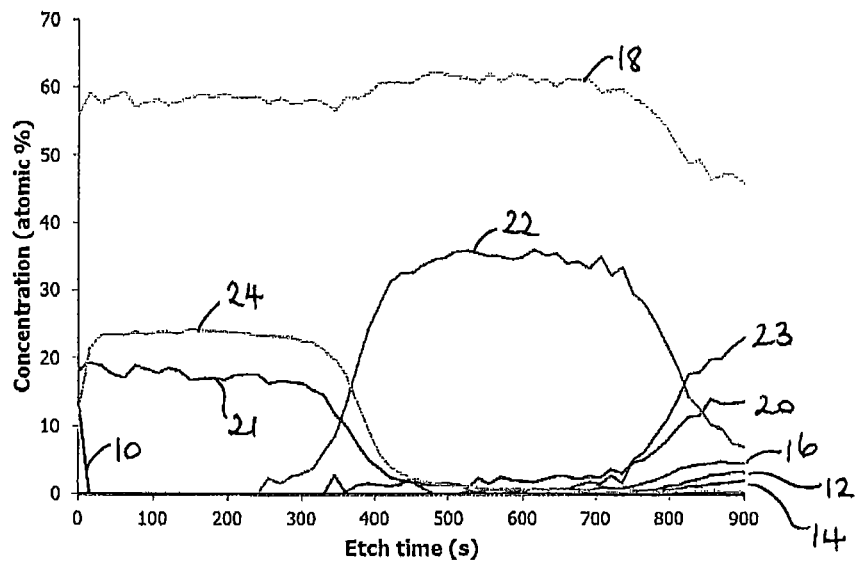
FIG. 16 is an x-ray photoelectron spectroscopy (XPS) depth profile for Example 82.

FIG. 16 is an x-ray photoelectron spectroscopy (XPS) trace for Example 82. FIG. 16 illustrates that the layer (film) deposited comprises zinc atoms and oxygen atoms and phosphorus atoms. Table 15 provides the stoichiometry of the zinc oxide layer for Example 82 as $ZnO:P_{0.75}$.

Figure 17:
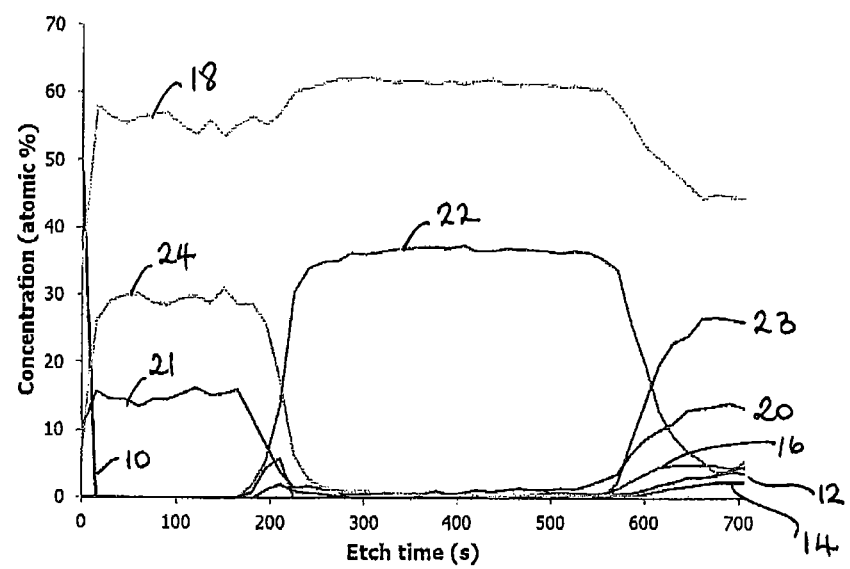
FIG. 17 is an x-ray photoelectron spectroscopy (XPS) depth profile for Example 83

FIG. 17 is x-ray photoelectron spectroscopy (XPS) trace for Example 83. FIG. 17 illustrates that the film deposited comprises zinc atoms, oxygen atoms and phosphorus atoms. Table 15 also provides stoichiometry of the zinc oxide layer for Example 83 as $ZnO:P_{0.5}$.

Table 15 shows that it is possible to deposit both 'pure' zinc oxide films, that is, zinc oxide film which do not comprise phosphorus, and also phosphorus doped zinc oxide films using triethyl phosphite by the method of the present invention.

TABLE 13

| Example or Comparative Example (CE) | Reactor Temperature (° C.) | DEZ Carrier Gas Flow (L/min) | DEZ vessel T (° C.) | TEP Carrier Gas Flow (L/min) | TEP vessel T (° C.) | Oxidant Amount (cm³/hour) | Run Time (s) |
|---|---|---|---|---|---|---|---|
| 82 | 600 | 0.64 | 72.0 | 1.96 | 104.0 | 0.00 | 30 |
| 83 | 600 | 0.32 | 72.0 | 0.95 | 105.0 | 0.00 | 30 |

In Table 13 there is illustrated the experimental conditions used for the preparation of examples 82 and 83.

TABLE 14

| Example or Comparative Example (CE) | Molar Ratio DEZ:TEP | Molar Ratio DEZ:Oxidant | Molar Ratio TEP:Oxidant |
|---|---|---|---|
| 82 | 3.003 | 0.000 | 0.000 |
| 83 | 3.014 | 0.000 | 0.000 |

In Table 13 there is illustrated the experimental conditions used for the preparation of examples 82 and 83.

TABLE 15

| Example or Comparative Example (CE) | Average concentration in the coating (atomic %) | | |
|---|---|---|---|
| | Zinc (Zn) | Oxygen (O) | Phosphorus (P) |
| 82 | 23.6 | 58.5 | 17.9 |
| 83 | 29.2 | 55.8 | 15.0 |

In Table 15 ere is illustrated the average concentration of each of the elements zinc, oxygen and phosphorus, present in the zinc oxide layer prepared according to the present invention for examples 82 and 83.

Figure 18:
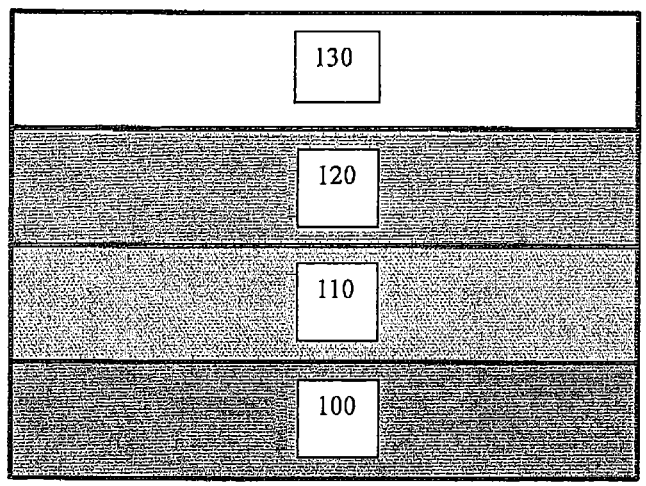
FIG. 18 is a schematic representation of a photovoltaic cell comprising a zinc oxide coating applied by the method of the present invention to a coated glass substrate.

Therefore, by using the method of the present invention it is possible to deposit a zinc oxide coating layer atop a substrate, such as float glass. The zinc oxide coating may be applied to a layer of silica oxide or tin oxide deposited on the glass substrate such as float glass. The resultant coated glass may be used in a range of applications, including but not limited to, a photovoltaic cell. When used in a photovoltaic cell, the zinc oxide coating prepared according to the present invention may be deposited over a layer of fluorine doped tin oxide, the fluorine doped tin oxide being part of a transparent conductive coating, applied above a glass substrate such as float glass. In this regard, FIG. 18 is a schematic representation of a photovoltaic cell comprising a zinc oxide coating layer 120, applied above a transparent conductive coating (TCO) 110, deposited on a glass substrate, such as float glass 100. In a photovoltaic cell, photovoltaic material 130 such as for example a cadmium telluride layer 130 may be applied above the zinc oxide layer 120.

The invention claimed is:

1. A method of depositing a coating comprising zinc oxide on a substrate, the method comprising,
providing a substrate,
providing a precursor mixture comprising an alkyl zinc compound and a phosphorus source, the phosphorus source comprising a compound of formula $O_nP(OR^3)_3$, wherein n is 0 or 1 and each $R^3$ is hydrocarbyl, and
delivering the precursor mixture to a surface of the substrate.

2. The method according to claim 1, wherein the precursor mixture further comprises an oxygen source.

3. The method according to claim 2, wherein the oxygen source comprises an ester.

4. The method according to claim 3, wherein the ester is selected from one or more of methyl acetate, ethyl acetate, propyl acetate, butyl acetate, or a mixture of two or more of these esters.

5. The method according to claim 4, wherein the ester comprises t-butyl acetate.

6. The method according to claim 1, wherein the alkyl zinc compound is dialkyl zinc.

7. The method according to claim 6, wherein $R^1$ and $R^2$ are each independently selected from methyl or ethyl.

8. The method according to claim 7, wherein $R^1$ and $R^2$ are each methyl or each ethyl.

9. The method according to claim 1, wherein each $R^3$ is independently selected from a substituted or unsubstituted $C_1$-$C_4$ alkyl.

10. The method according to claim 9, wherein each $R^3$ is propyl, ethyl or methyl.

11. The method according to claim 1, wherein the precursor mixture is a gaseous precursor mixture.

12. The method according to claim 1, wherein the method is atmospheric pressure chemical vapour deposition.

13. The method according to claim 1, wherein the substrate comprises glass.

14. The method according to claim 13, wherein the substrate comprises float glass.

15. The method according to claim 1, wherein the surface of the substrate is at a temperature in the range 300° C. to 800° C.

16. The method according to claim 15, wherein the surface of the substrate is at a temperature in the range 580° C. to 650° C.

17. The method according to claim 1, wherein the coating comprising zinc oxide is deposited on-line on a ribbon of float glass during a float glass production process.

18. The method according to claim 17, wherein the coating comprising zinc oxide is deposited whilst the ribbon of float glass is in the float bath.

19. The method according to claim 1, wherein the alkyl zinc compound is dialkyl zinc of formula $R^1R^2Zn$, wherein $R^1$ and $R^2$ are each independently selected from a substituted or unsubstituted $C_1$-$C_4$ alkyl or phenyl.

* * * * *